United States Patent

Tan et al.

[11] Patent Number: 5,965,462
[45] Date of Patent: Oct. 12, 1999

[54] METHOD FOR FORMING A GATE STRUCTURE USED IN BORDERLESS CONTACT ETCHING

[75] Inventors: Wen-Yi Tan, Taipei; Marlon Tsai, Jupei; Ray Lee, Taipei, all of Taiwan

[73] Assignee: Mosel Vitelic, Inc., Hsinchu, Taiwan

[21] Appl. No.: 08/958,385

[22] Filed: Oct. 27, 1997

[51] Int. Cl.⁶ ................................................. H01L 21/00
[52] U.S. Cl. ..................... 438/719; 438/724; 438/738; 438/744
[58] Field of Search ................ 216/67, 79; 438/265, 438/719, 721, 724, 738, 744

[56] References Cited

U.S. PATENT DOCUMENTS 5,753,565  5/1998  Becker ................................ 438/744 X
5,756,216  5/1998  Becker et al. ........................ 438/744 X
5,851,927  12/1998  Cox et al. ............................... 438/744

Primary Examiner—William Powell
Attorney, Agent, or Firm—Merchant & Gould, P.C.

[57] ABSTRACT

A method for forming a gate structure used in borderless contact etching is disclosed including the steps described below. Forming a conductive layer on a substrate, followed by forming a first silicon nitride layer on the conductive layer. The next step is to pattern a gate electrode by etching all the layers formed in the steps mentioned previously. The following steps is to form a second silicon nitride layer on the surface of the gate electrode and the substrate. Finally, etching the second silicon nitride layer to form a nitride spacer on the side walls of the gate electrode. The altitude of the nitride spacer is higher than the altitude of the first silicon nitride layer.

16 Claims, 6 Drawing Sheets

METHOD FOR FORMING A GATE STRUCTURE USED IN BORDERLESS CONTACT ETCHING

BACKGROUND OF THE INVENTION

1. Field of the Invention

This invention is relates to a method of forming a gate structure, especially relates to a method of forming a gate structure used in borderless contact etching.

2. Description of the Prior Art

In the 0.3 µm process, or below, used in fabricating dynamic random access memory (DRAM), the design rule is tightened due to the shrink of the contact window, and the bottle neck of exposure (I-line) is thus formed. In order to solve the problem aformentioned, the borderless contact etching process is developed.

The borderless contact etching process utilizes the etching-rate difference between two different materials to form a borderless contact, e.g., oxide to nitride, thus the borderless contact etching is achieved. The technique using borderless contact etching process is described below. Referring to FIG. 1A, the first step is to deposit a poly silicon layer 100 on a substrate 101, followed by depositing a silicon nitride layer 102 of 2000 angstroms in thickness.

The gate electrode 103 in FIG. 1B is formed by etching portions of layer 100 and layer 102. The etching process used to remove the portions of layer 100 and 102 is performed by conventional wet etching using a developed photoresist as a mask (not shown). Referring to FIG. 1C, to form a silicon nitride spacer, a layer composed of silicon nitride 104 of 1200 angstroms in thickness is formed by chemical vapor deposition on the surface of substrate 101 and gate electrode 103. The following step is to etch the silicon nitride layer 104 anisotropically to form the silicon nitride spacer 105 shown in FIG. 1D. The gate electrode and the spacers are thus formed. The following steps fabricating a DRAM is omitted. To make the metal interconnect, the contact window is formed by the following steps.

Deposit a silicon dioxide layer 106 on the topography of the wafer shown in FIG. 1E followed by etching the silicon dioxide layer 106 by an anisotropic etching to form a contact. The recipe used to make the contact is the mixture of $C_4F_8/CO/Ar$, the pressure is about 0.045 Torr and the power is about 1400 Watts. Due to the etching rate of the silicon dioxide is larger than that of the silicon nitride, the cross sectional view of the wafer is shown in FIG. 1E. The profile of the silicon nitride spacer 105 and the silicon nitride layer 102 shown in FIG. 1E is under the ideal condition. In fact, the silicon nitride loss in the corner of silicon nitride spacer 105 is more than that of the silicon nitride layer 102 of gate electrode 103, so the realistic cross sectional view of the wafer is shown in FIG. 1F.

To avoid the exposure of the poly silicon layer 100 during the etching step, the thickness of the silicon nitride spacer 105 must be thick enough, e.g., 2000 angstroms in thickness, to compensate the loss of the silicon nitride spacer 105. If the silicon nitride layer 102 were too thick, the step height will be worse because the thickness of the stack of the layers is increased. In addition, in the later section process, e.g., the 3C contact etching process, the control of etching is critical. The condition described above is shown in FIG. 2.

The multi-layer contact etching, etching the silicon dioxide 200 to contact first poly gate electrode 201, the bit line 202, the active region 203 and the electrode plate 204, is usually used in fabricating the stacked DRAM. The recipe etches silicon dioxide and silicon nitride, whereas it does not etch poly silicon. Thus, if the silicon nitride layer 205 on first poly gate electrode 201 is too thick, when fabricating the contact, the first poly gate electrode 201 may be open circuited or the bit line 202 and electrode plate 204 may be etched through.

It is obvious that the technique used to form the borderless contact etching is a critical process due to the thickness of the silicon nitride on the gate poly silicon. To overcome the disadvantage of the technique mentioned above, the structure of the gate electrode must be improved to avoid the affect of the thickness of the silicon nitride on the gate poly silicon.

SUMMARY OF THE INVENTION

A method for forming a gate structure used in borderless contact etching including the steps described below. The first step is to deposit a conductive layer on a substrate. Then forming a first silicon nitride layer on the conductive layer, the first silicon nitride layer is formed by plasma enhanced chemical vapor deposition (PECVD). The next step is to pattern a gate electrode by etching all the layers formed in the previous steps.

Next, forming a second silicon nitride layer on the surface of the gate electrode and the substrate, the second silicon nitride layer is formed by low pressure chemical vapor deposition (LPCVD). Finally, etching the second silicon nitride layer to form a nitride spacer on the side walls of the gate electrode, wherein the second silicon nitride layer is etched by an anisotropic etching that makes the altitude of the nitride spacer higher than the first silicon nitride layer. Thus the horn structure is formed.

The conductive layer described above is poly silicon or polycide, and the anisotropic etching uses the mixture of $C_2F_6$ and HBr as the recipe. In addition, the pressure of the mixture is about 0.01 Torr, and the source power of the mixture is about 500 Watts.

BRIEF DESCRIPTION OF THE DRAWINGS

The above features of the present invention will be more clearly understood from consideration of the following descriptions in connection with accompanying drawings in which:

FIG. 1A shows the substrate with a poly silicon layer and a first silicon nitride layer deposited on it.

FIG. 1B shows that the poly silicon layer and the first silicon nitride layer are etched.

FIG. 1C shows that the second silicon nitride layer are deposited on the topography of the wafer.

FIG. 1D shows that the silicon nitride spacer are formed by etching the second silicon nitride layer.

FIG. 1E shows that the contact is formed in the silicon dioxide layer, and the silicon nitride spacer is under the ideal condition.

FIG. 1F shows that the contact is formed in the silicon dioxide layer, and the silicon nitride spacer is under the realistic condition.

FIG. 3A shows the substrate with a poly silicon layer and a first silicon nitride layer deposited on it. The first silicon nitride layer is deposited by PECVD.

FIG. 3B shows that the poly silicon layer and the first silicon nitride layer are etched.

FIG. 3C shows that the second silicon nitride layer are deposited on the topography of the wafer. The second silicon nitride layer is deposited by LPCVD.

FIG. 3D shows that the silicon nitride spacer are formed by etching the second silicon nitride layer. Due to the difference etching rate between the silicon nitride made from different methods, the horn structure of the gate electrode and the spacer is formed. Thus, the gate structure according to the present invention used in borderless contact etching is completed.

FIG. 3E shows that the silicon nitride layer is deposited on the wafer, and the photoresist is spun over the topography of the wafer.

FIG. 3F shows the realistic condition that the contact is formed in the silicon dioxide layer, and the poly silicon layer is prevented from been exposed due to the compensation for the silicon nitride loss offered by the silicon nitride spacer.

FIG. 4A is the cross sectional view of the wafer with a poly silicon layer, a first silicon nitride layer and a silicon dioxide layer deposited on a substrate.

FIG. 4B is the cross sectional view of the wafer with the poly silicon layer, the first silicon nitride layer and the silicon dioxide layer etched.

FIG. 4C shows that the silicon nitride spacer are formed by etching the second silicon nitride layer. The first silicon nitride layer are prevented from been exposed by the shielding oxide layer.

DESCRIPTION OF THE PREFERRED EMBODIMENT

To improve the disadvantage mentioned in the prior art, the present invention offers a method fabricating a horn structure gate electrode. The horn structure gate electrode can compensate the silicon nitride loss in the corner of the spacer, because the altitude of the silicon nitride spacer is higher than the silicon nitride layer on the poly silicon layer of gate electrode. The silicon nitride of the horn structure above the horizontal silicon nitride layer will compensate the larger silicon nitride loss in the top corner of the spacer.

Figure 1A:
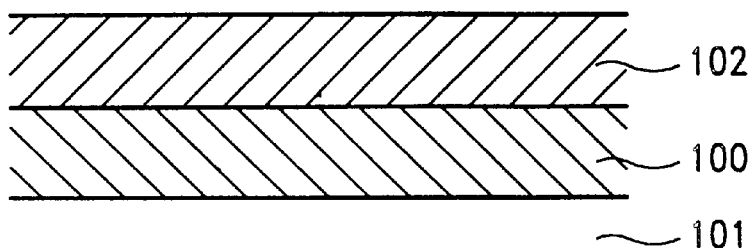
FIG. 1A~FIG. 1F shows the steps of the gate structure and the borderless contact etching according to the prior art.
Figure 1B:
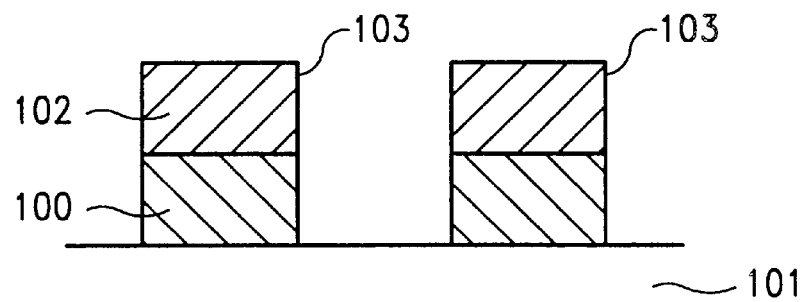
Figure 1C:
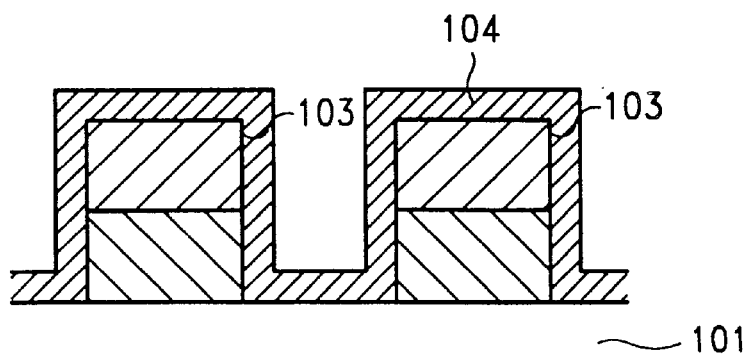
Figure 1D:
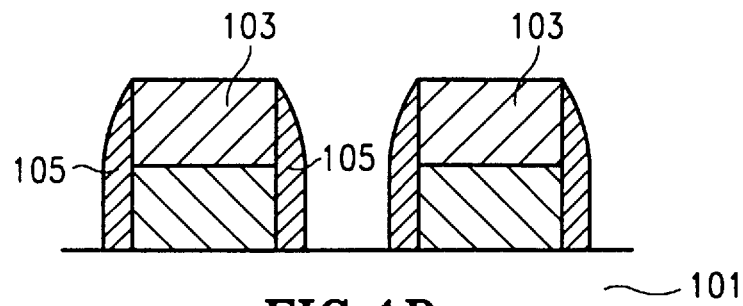
Figure 1E:
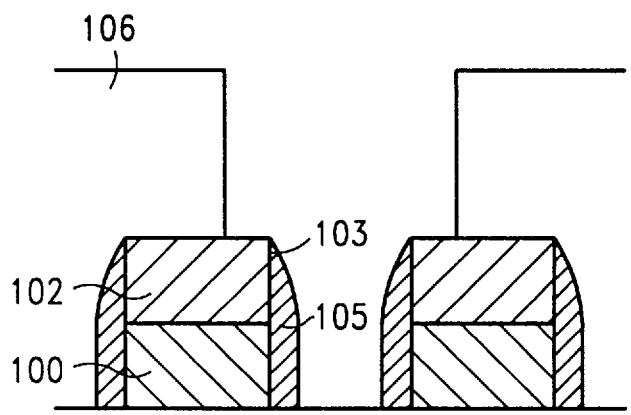
Figure 1F:
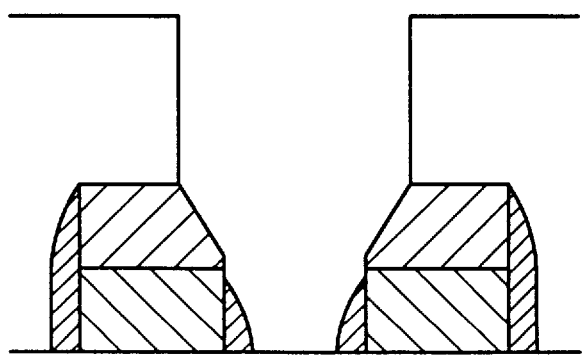
Figure 2:
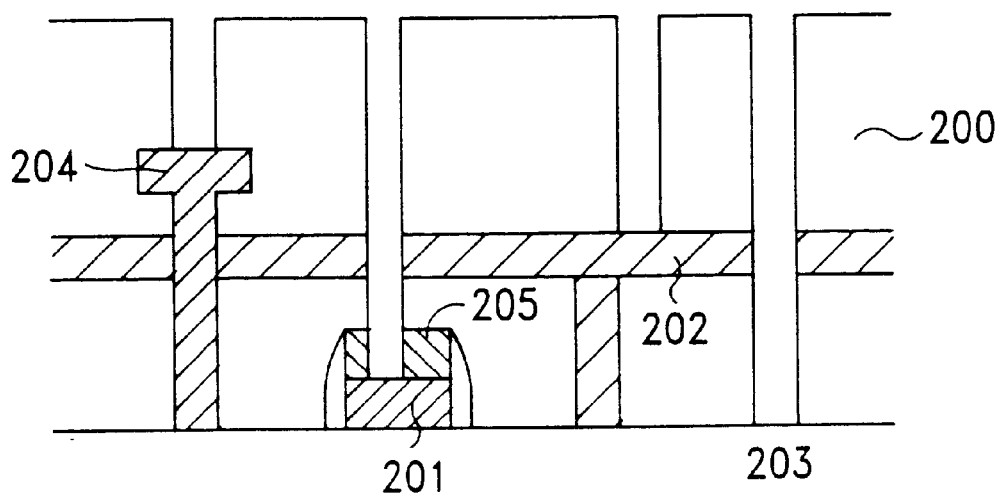
FIG. 2 shows the critical condition in the 3C contact etching induced by the improper thickness of the silicon nitride layer.
Figure 3A:
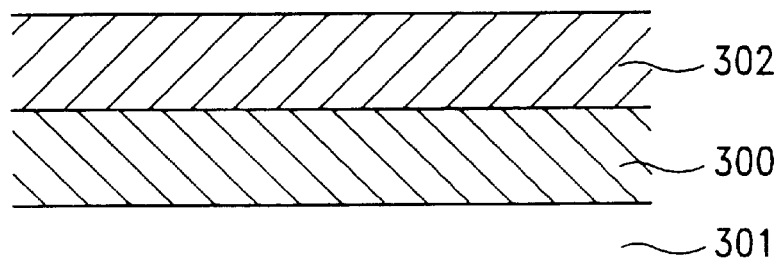
FIG. 3A~FIG. 3F shows the steps forming a gate structure according to the present invention used in borderless contact etching.
Figure 3B:
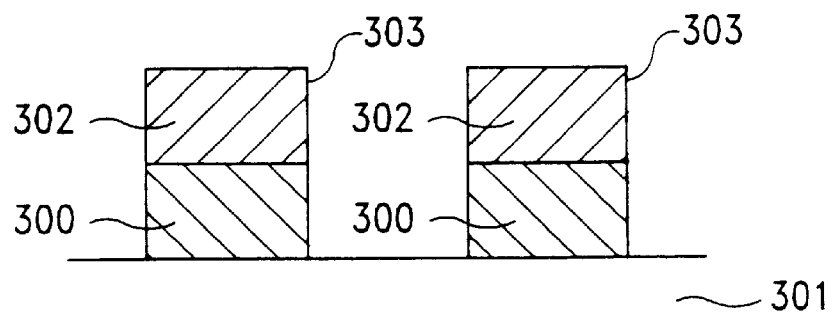

The process used to fabricate the horn structure gate electrode is described below. In the first preferred embodiment, referring to FIG. 3A, a poly silicon layer 300 is deposited on a substrate 301 followed by depositing a first silicon nitride layer 302. Then, a first silicon nitride layer 302 of 2500 angstroms in thickness is formed by plasma enhanced chemical vapor deposition (PECVD). The next step is to etch the layers mentioned above to form the gate electrode 303 shown in FIG. 3B. The gate electrode 303 consists the first silicon nitride layer 302 and the poly silicon layer 300.

Figure 3C:
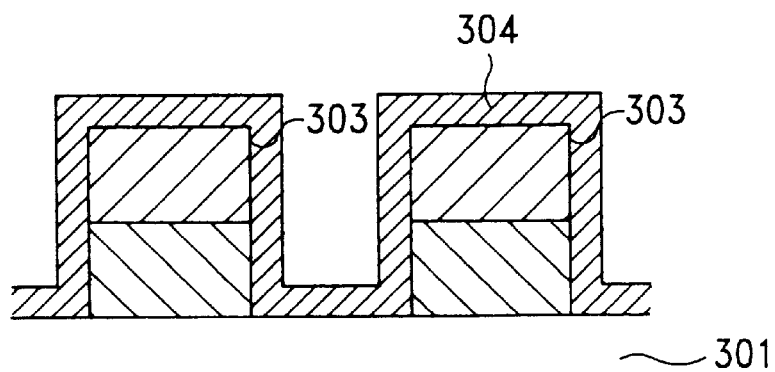
Figure 3D:
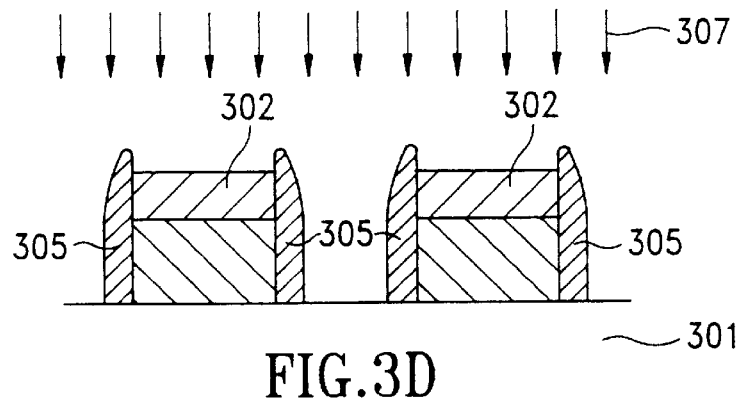

The following step is to deposit a second silicon nitride layer 304 on the topography of the wafer shown in FIG. 3C, the second silicon nitride layer 304 is formed by low pressure chemical vapor deposition (LPCVD). The thickness of the second silicon nitride layer 304 is about 1200 angstroms. The next step is to form the silicon nitride spacer of the gate electrode by anisotropically etching the second silicon nitride layer 304 by the first ion bombardment using the mixture of $C_2F_6$ and HBr as the recipe. The pressure of the recipe is about 0.01 Torr, and the power of the source is about 500 W. The arrow 307 in FIG. 3D represents the ion used to bombard the topography of the wafer. Because the etching rate of the first silicon nitride layer 302 is larger than that of the second silicon nitride layer 304 (about 2:1), the silicon nitride spacer 305 is thus formed in a horn shape. The gate electrode and the spacer shown in FIG. 3D is a horn structure. The altitude of the spacer is about 2000 angstroms, whereas the altitude of the first silicon nitride layer 302 is reduced to 1500 anstroms or less.

Figure 3E:
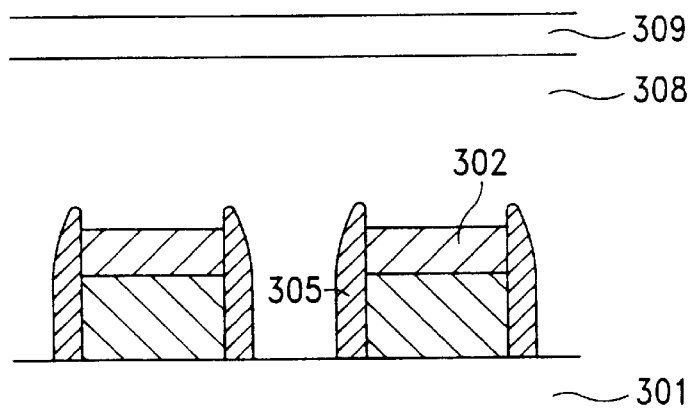
Figure 3F:
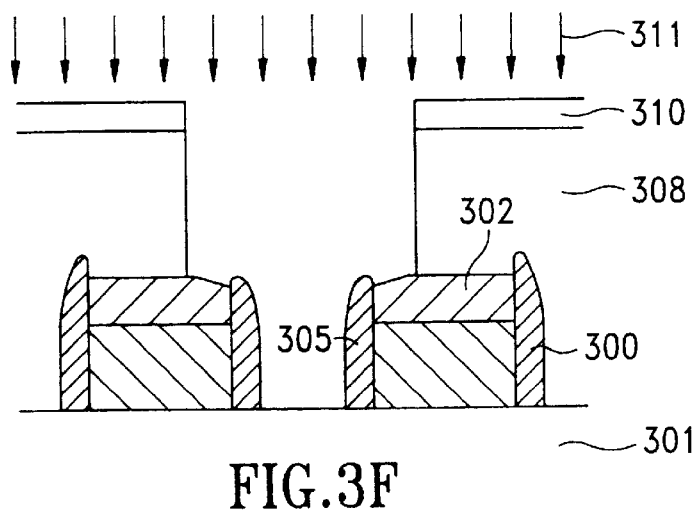

Referring to FIG. 3E, a silicon dioxide layer 308 is deposited on the topography of the wafer, followed by spinning on a photoresist layer 309 on the silicon dioxide layer 308. To form the contact, the photoresist layer 309 is developed to form a patterned photoresist layer 310 followed by the second ion bombardment 311. The recipe used in the second ion bombardment 311 is the mixture of $C_4F_8$, CO, and Ar. The pressure of the mixture is about 0.045 Torr and the power of the source is about 1400 Watts. The altitude of the silicon nitride spacer 305 is higher than that of the first silicon nitride layer 302 after the first ion bombardment 307. Referring to FIG. 3F, in addition, the silicon nitride loss of the top corner of the silicon nitride spacer 305 is more than that of the first silicon nitride layer 302, after the borderless contact etching steps, the height of silicon nitride spacer 305 and the first silicon nitride layer 302 are almost the same. Thus the poly silicon 300 is prevented from been exposed, and the thickness of the first silicon nitride layer 302 is effectively reduced.

Figure 4A:
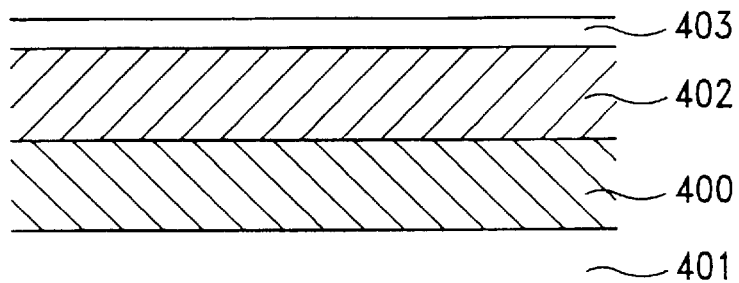
FIG. 4A~FIG. 4C shows the other preferred embodiment of the preferred embodiment.

In the second preferred embodiment, the horn structure gate electrode is formed by the similar steps with the first preferred embodiment except an additional silicon dioxide layer on the first silicon nitride layer. Referring to FIG. 4A, a poly silicon layer 400 is deposited on a substrate 401 followed by sequentially depositing a first silicon nitride layer 402 and a shielding oxide layer 403. The first silicon nitride layer 402 of 1500 angstroms in thickness is formed by plasma enhanced chemical vapor deposition (PECVD). The thickness of the shielding oxide layer 403 is about 500 angstroms in thickness.

Figure 4B:
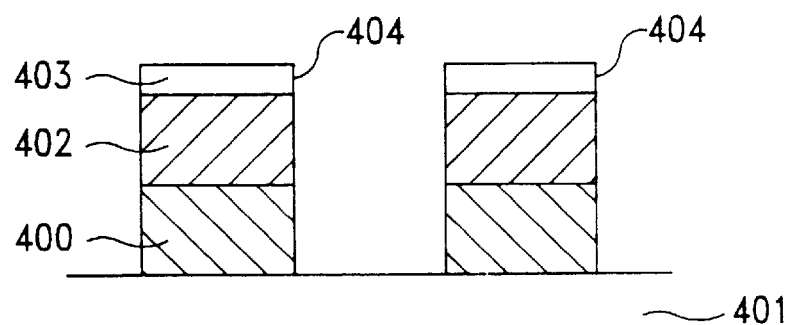

The next step is to etch the layers mentioned above to form the gate electrode 404 shown in FIG. 4B. The gate electrode 404 consists the first silicon nitride layer 402, the poly silicon layer 400 and the shielding oxide layer 403.

Figure 4C:
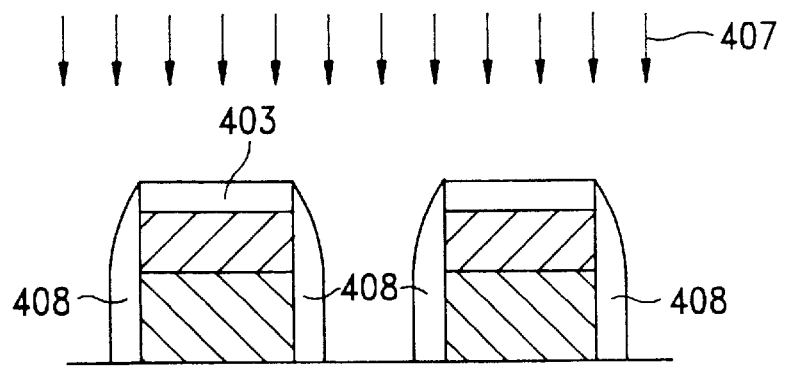

Referring to FIG. 4C, the following step is to form a silicon nitride spacer 408. To form a silicon nitride spacer 408, a second silicon nitride layer described in the first preferred embodiment is then deposited and etched by the first ion bombardment 407. The first ion bombardment 407 uses the same recipe and under the same environment as that of the first ion bombardment in the first preferred embodiment. The arrow 407 in FIG. 4C represents the ion used to bombard the topography of the wafer. Because the shielding oxide 403 prevent the first silicon nitride layer 402 from been etched, the thickness of the first silicon nitride layer 402 is under well control.

The plasma enhanced chemical vapor deposition used to deposit the first silicon nitride layer is in the environment of 480° C. and 1~5 Torr. Whereas, the method used to deposit the second silicon nitride layer is low pressure chemical vapor deposition which is in the environment of 700~800° C. and 1~5 Torr.

The gate electrode according to the second preferred embodiment of the present invention is thus formed. In the following steps, the silicon dioxide layer and the photoresist layer are sequentially deposited on the topography of the wafer, and the cross sectional view is the same as FIG. 3E. The following steps used to fabricate the contact are the same as that of the first preferred embodiment, and the final result is shown in FIG. 3F. Thus the poly silicon is prevented from been exposed.

Although specific embodiments have been illustrated and described, it will be obvious to those skilled in the art that various modification may be made without departing from the spirit which is intended to be limited solely by the appended claims.

What is claimed is:

1. A method for forming a gate structure comprising the steps of:

forming a conductive layer on a substrate;

forming a first silicon nitride layer on said conductive layer;

patterning a gate electrode by etching said conductive layer and said first silicon nitride layer;

forming a second silicon nitride layer on the surface of said gate electrode and said substrate; and etching said second silicon nitride layer to form a nitride spacer on the side walls of said gate electrode, wherein said first silicon nitride layer and said second silicon nitride layer have different etching rates, and the altitude of said nitride spacer is higher than the altitude of said first silicon nitride layer.

2. The method as claim 1, wherein said conductive layer is selected from the group consisting of: poly silicon and polycide.

3. The method as claim 1, wherein said second silicon nitride layer is formed by plasma enhanced chemical vapor deposition (PECVD).

4. The method as claim 1, wherein said second silicon nitride layer is formed by low pressure chemical vapor deposition (LPCVD).

5. The method as claim 1, wherein said second silicon nitride layer is etched by an anisotropic etching.

6. The method as claim 5, wherein said anisotropic etching uses the mixture of $C_2F_6$ and HBr as the recipe.

7. The method as clam 6, wherein the pressure of said mixture is about 0.01 Torr, and the source power of the mixture is about 500 Watts.

8. The method as claim 1, wherein said method for forming a gate structure used in borderless contact etching further comprising the step of: forming a second dielectric layer on said first silicon nitride layer before patterning said gate electrode.

9. The method as claim 8, wherein said second dielectric layer is silicon dioxide.

10. A method for forming a gate structure used in borderless contact etching comprising the steps of:

forming a conductive layer on a substrate;

forming a first silicon nitride layer on said conductive layer, wherein said first silicon nitride layer is formed by plasma enhanced chemical vapor deposition (PECVD);

patterning a gate electrode by etching said conductive layer and said first silicon nitride layer;

forming a second silicon nitride layer on the surface of said gate electrode and said substrate, wherein said second silicon nitride layer is formed by low pressure chemical vapor deposition (LPCVD); and etching said second silicon nitride layer to form a nitride spacer on the side walls of said gate electrode, wherein said first silicon nitride layer and said second silicon nitride layer have different etching rates, and the altitude of said nitride spacer is higher than the altitude of said first silicon nitride layer.

11. The method as claim 10, wherein said conductive layer is selected from the group consisting of: poly silicon and polycide.

12. The method as claim 11, wherein said second silicon nitride layer is etched by an anisotropic etching.

13. The method as claim 12, wherein said anisotropic etching uses the mixture of $C_2F_6$ and HBr as the recipe.

14. The method as clam 13, wherein the pressure of said mixture is about 0.01 Torr, and the source power of the mixture is about 500 Watts.

15. The method as claim 10, wherein said method for forming a gate structure used in borderless contact etching further comprising the step of: forming a second dielectric layer on said first silicon nitride layer before patterning said gate electrode.

16. The method as claim 15, wherein said second dielectric layer is silicon dioxide.

* * * * *